US009545004B2

(12) United States Patent
Minich et al.

(10) Patent No.: US 9,545,004 B2
(45) Date of Patent: Jan. 10, 2017

(54) PRINTED CIRCUIT BOARD HAVING ORTHOGONAL SIGNAL ROUTING

(71) Applicant: FCI Americas Technology LLC, Carson City, NV (US)

(72) Inventors: Steven E. Minich, York, PA (US); Mark R. Gray, York, PA (US)

(73) Assignee: FCI Americas Technology LLC, Carson City, NV (US)

( * ) Notice: Subject to any disclaimer, the term of this patent is extended or adjusted under 35 U.S.C. 154(b) by 335 days.

(21) Appl. No.: 14/164,338

(22) Filed: Jan. 27, 2014

(65) Prior Publication Data

US 2014/0209371 A1 Jul. 31, 2014

Related U.S. Application Data

(60) Provisional application No. 61/758,271, filed on Jan. 29, 2013, provisional application No. 61/778,990, filed on Mar. 13, 2013.

(51) Int. Cl.
*H05K 1/11* (2006.01)
*H05K 1/14* (2006.01)
*H05K 1/02* (2006.01)

(52) U.S. Cl.
CPC .............. *H05K 1/141* (2013.01); *H05K 1/116* (2013.01); *H05K 1/0298* (2013.01); *H05K 2201/044* (2013.01); *H05K 2201/09409* (2013.01); *H05K 2201/10295* (2013.01); *Y10T 29/49165* (2015.01)

(58) Field of Classification Search
CPC H05K 2201/092; H05K 1/0228; H05K 1/116; H05K 2201/09227; H05K 2201/044; H05K 1/115; H05K 1/0245; H01R 13/6471
See application file for complete search history.

(56) References Cited

U.S. PATENT DOCUMENTS

| 5,180,440 A | * | 1/1993 | Siegel | G09B 19/24 136/200 |
|---|---|---|---|---|
| 5,258,890 A | * | 11/1993 | de Veer | H05K 1/029 174/261 |
| 8,556,657 B1 | * | 10/2013 | Nichols | H01R 13/6471 439/607.07 |
| 2004/0216071 A1 | | 10/2004 | Miller | |
| 2005/0161254 A1 | * | 7/2005 | Clink | H05K 1/0245 174/262 |

(Continued)

FOREIGN PATENT DOCUMENTS

| JP | 2002/530839 | 9/2002 |
|---|---|---|
| JP | 2008/084830 | 4/2008 |
| WO | WO 0031832 | 6/2000 |

OTHER PUBLICATIONS

Extended European Search Report for European Application No. 14746098.4 dated Oct. 28, 2016.

*Primary Examiner* — Steven T Sawyer
(74) *Attorney, Agent, or Firm* — Wolf, Greenfield & Sacks, P.C.

(57) ABSTRACT

In accordance with the various embodiments disclosed herein, electrical connector footprints, such as printed circuit boards, is described comprising one or more of signal traces that each include a first section that extends parallel to the linear array direction and a second section extends in a direction that is different than the linear array direction.

17 Claims, 7 Drawing Sheets

(56) References Cited

U.S. PATENT DOCUMENTS

| | | |
|---|---|---|
| 2008/0101050 A1 | 5/2008 | Fung |
| 2009/0011620 A1 | 1/2009 | Avery et al. |
| 2010/0144203 A1 | 6/2010 | Glover et al. |
| 2011/0076860 A1 | 3/2011 | Cohen et al. |
| 2012/0270420 A1* | 10/2012 | Lapidot .............. H01R 13/6471 439/65 |
| 2013/0273781 A1 | 10/2013 | Buck et al. |

* cited by examiner

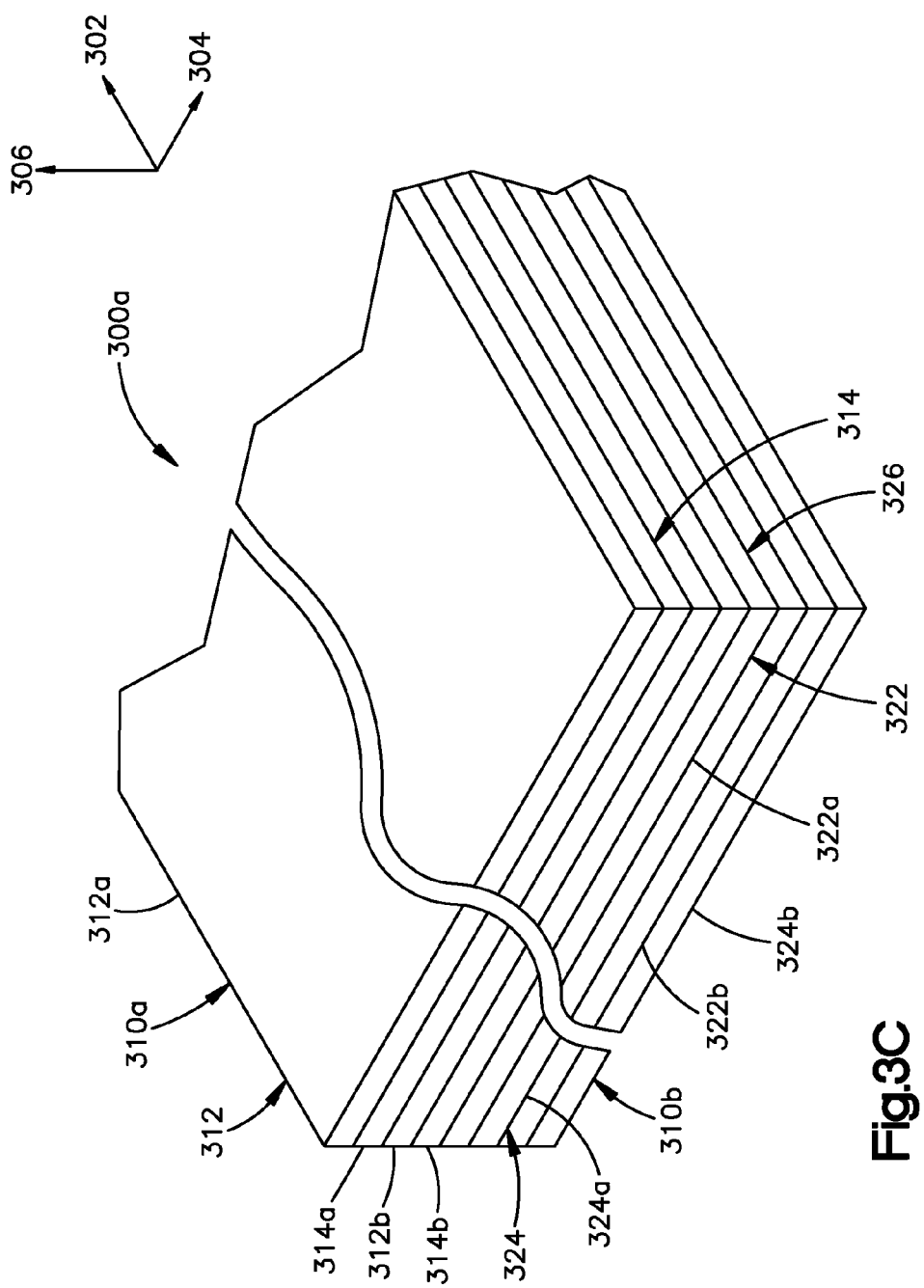

PRINTED CIRCUIT BOARD HAVING ORTHOGONAL SIGNAL ROUTING

CROSS REFERENCE TO RELATED APPLICATIONS

This claims the benefit of U.S. Patent Application Ser. No. 61/758,271 filed Jan. 29, 2013, the disclosure of which is hereby incorporated by reference as if set forth in its entirety herein. This further claims the benefit of U.S. Patent Application Ser. No. 61/778,990, filed Mar. 13, 2013.

BACKGROUND

Typically, a printed circuit board includes a plurality of electrically conductive layers and electrically insulative layers that are interleaved between adjacent ones of the electrically conductive layers. The electrically conductive layers can include electrically conductive ground layers and electrically conductive signal layers. Conventional printed circuit boards have an arrangement of plated through holes, or vias, that are arranged along a plurality of linear arrays that include ground vias and signal vias. The signal vias can be arranged in differential signal pairs that are separated by one or more ground vias along the respective linear array. Conventional printed circuit boards contain routing channels that each contain respective sets of differential signal traces that are electrically connected to the signal vias. The routing channels, and thus the signal traces, are normally located in a signal layer above or below the ground layer. These routing channels typically located between adjacent linear arrays and extend parallel to the linear arrays.

SUMMARY

In accordance with one embodiment, a printed circuit board defining a front card edge. The printed circuit board can include a first linear array of vias including at least one first ground via and at least one first signal via, and a second linear array of vias spaced from the first linear array along a first direction. The second linear array can include at least one second ground via and at least one second signal via, wherein each of the first and second linear arrays of vias extends along a second direction that is perpendicular to the first direction and parallel to the front card edge. The printed circuit board can further include a first electrical signal trace defining a first end that is electrically connected to the first signal via, a first region that extends along the second direction, and a second region that extends along the first direction. The printed circuit board can further include a second electrical signal trace defining a first end that is electrically connected to the second signal via, a first region that extends along the second direction, and a second region that extends along the first direction.

BRIEF DESCRIPTION OF THE DRAWINGS

The foregoing summary, as well as the following detailed description of an example embodiment of the application, will be better understood when read in conjunction with the appended drawings. For the purposes of illustrating the present disclosure, there is shown in the drawings an example embodiment. It should be understood, however, that the application is not limited to the precise arrangements and instrumentalities shown. In the drawings:

FIG. 3C is a perspective view of a portion of the printed circuit board illustrated in FIGS. 3A and 3B.

DETAILED DESCRIPTION OF ILLUSTRATIVE EMBODIMENTS

Figure 1A:
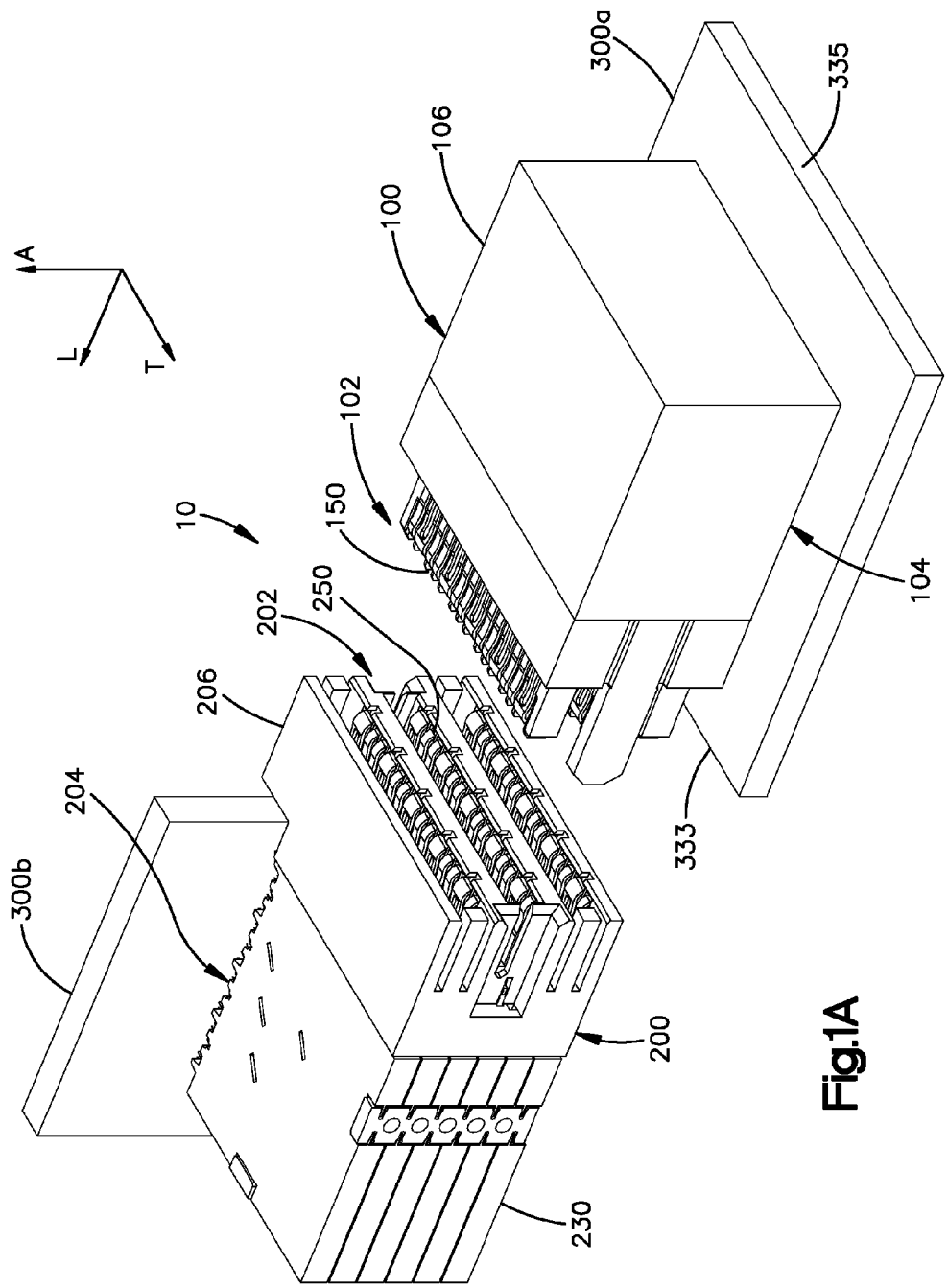
FIG. 1A is a perspective view of an electrical connector assembly constructed in accordance with another embodiment, including first and second substrates, a first electrical connector configured to be mounted to the first substrate, a second electrical connector that is orthogonal to the first connector and configured to be mounted to the second substrate, wherein the first and second electrical connectors are configured to be directly mated with each other.

In accordance with the various embodiments disclosed herein, a printed circuit board includes a signal layer with a first routing channel disposed between a pair of first and second linear arrays that each include ground vias and signal vias. The first routing channel can include a first plurality of electrical signal traces that are in electrical communication with respective first ones of the signal vias of a select one of the first and second linear arrays. The first routing channel, and thus each of the first plurality of signal traces, may include a first portion that extends in a first direction parallel to a printed circuit board (PCB) card edge and a second portion which extends relative to the first portion in a second direction away from the card edge. For example, the second direction may be perpendicular to the first direction. The signal layer can further include a second routing channel disposed between the same pair of first and second linear arrays. The second routing channel can include a second plurality of electrical signal traces that are in electrical communication with respective second ones of the signal vias of the select one of the first and second linear arrays. The second ones of the signal vias are different than the first ones of the signal vias. The second routing channel, and thus each of the second signal traces, can include a first portion that extends in a third direction that is parallel to the PCB card edge and further parallel to the first direction and opposite the first direction. Thus, the first portions of the first and second routing channels may extend along the PCB card edge. The second routing channel, and thus each of the second plurality of signal vias, may also include a second portion that extends relative to the first portion in the second direction.

The present disclosure may be understood more readily by reference to the following detailed description taken in connection with the accompanying figures and examples, which form a part of this disclosure. It is to be understood that the present disclosure is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the present disclosure which are, for clarity, described herein in the context of separate embodiments, may also be provided in combination in a single embodiment. Conversely, various features of the present disclosure that are, for brevity, described in the context of a single embodiment, may also be provided separately or in any sub combination. Further, reference to values stated in ranges include each and every value within that range. Unless otherwise noted, common reference numbers among the Figures should be understood to refer to the same or similar features.

Figure 1B:
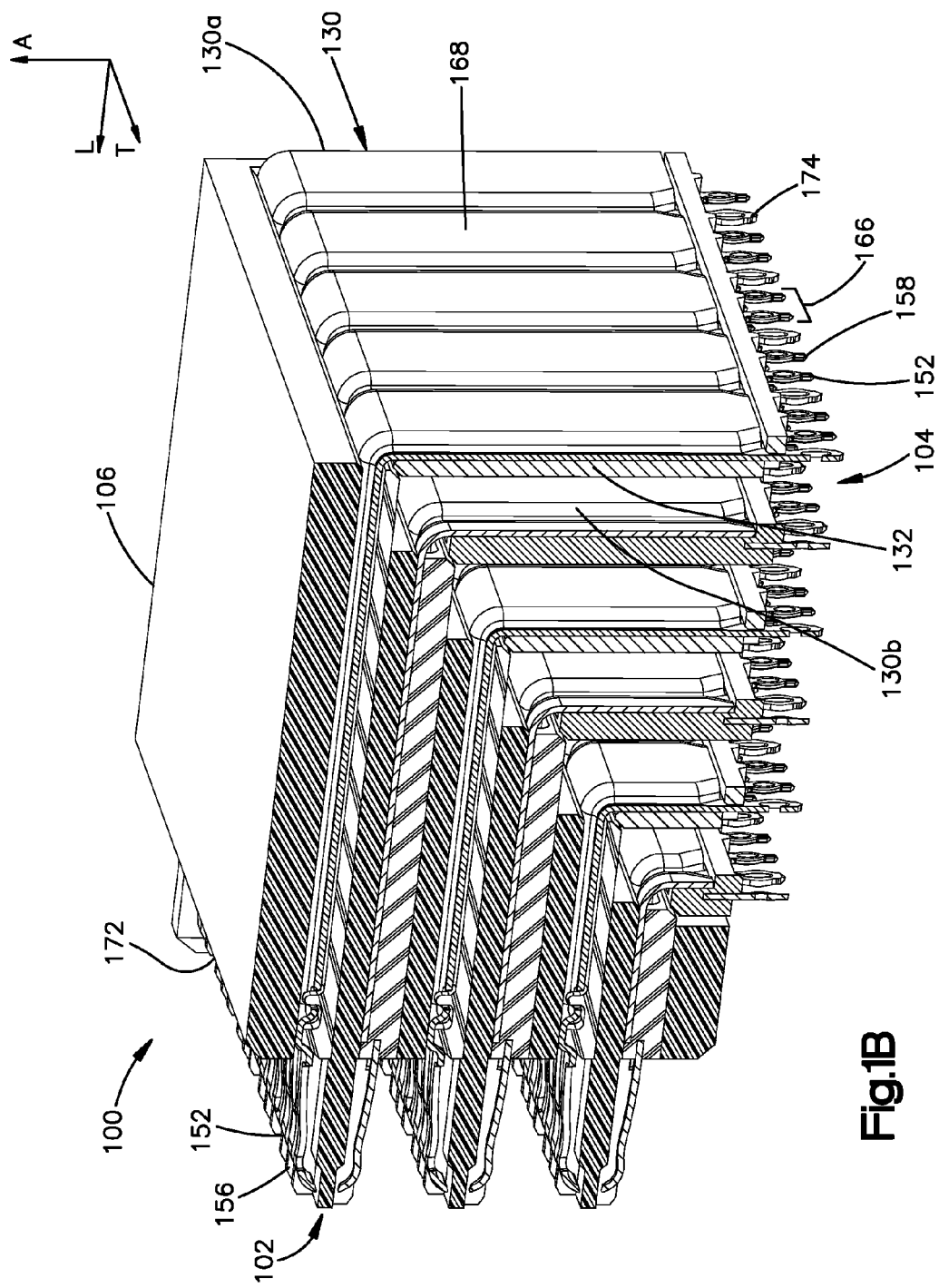
FIG. 1B is a sectional side elevation view of the first electrical connector illustrated in FIG. 1A.
Figure 1C:
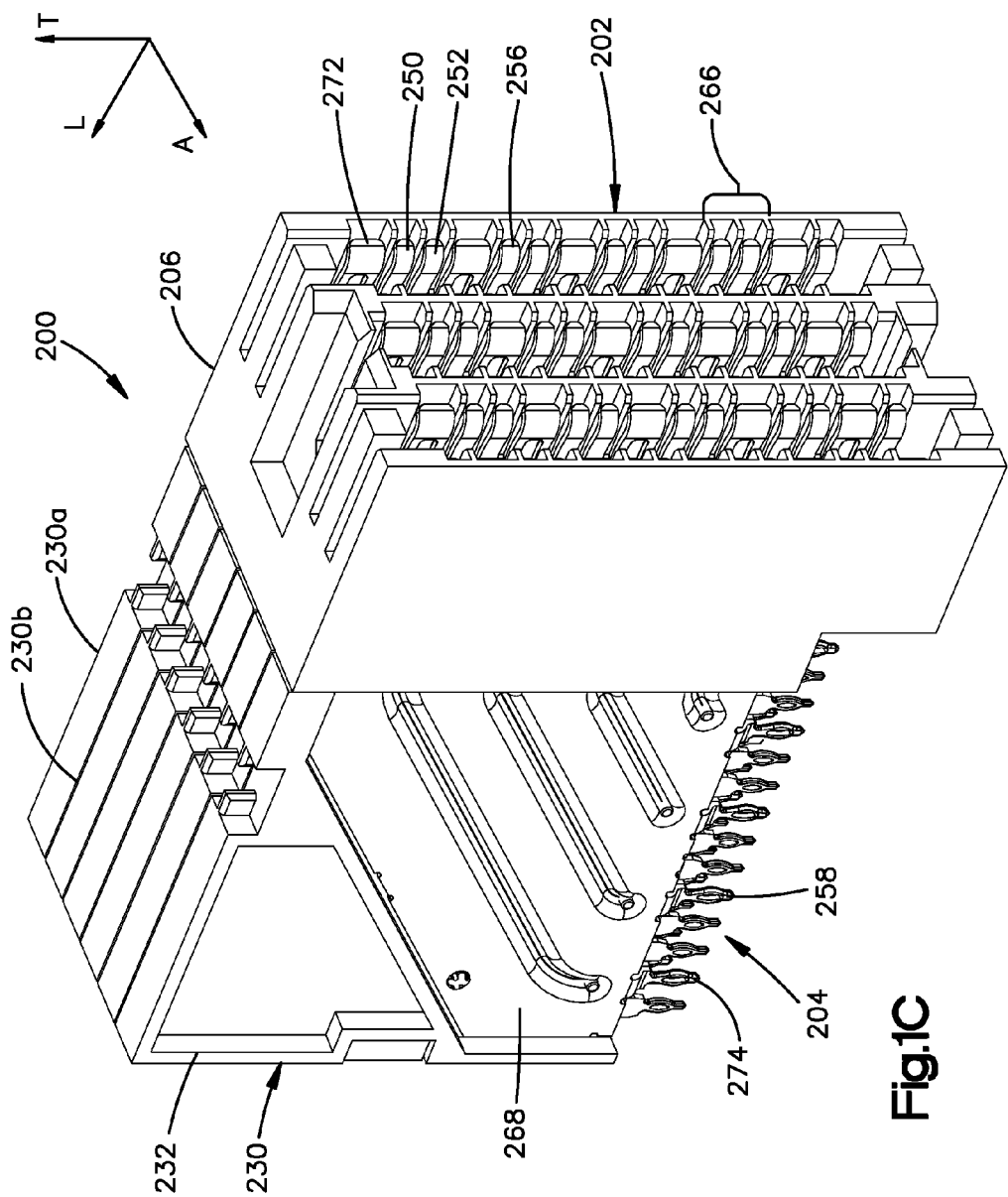
FIG. 1C is a perspective view of the second electrical connector illustrated in FIG. 1A.

Referring to FIGS. 1A-C, an electrical connector assembly 10 includes a first electrical connector 100, a second electrical connector 200 configured to be mated with the first electrical connector 100, a first substrate configured as a first printed circuit board 300a, and a second substrate configured as a second printed circuit board 300b. For instance, the first printed circuit board 300a can be configured as a backplane, or alternatively can be configured as a midplane, daughter card, or any suitable alternative electrical component. The second printed circuit board 300b can be configured as a daughter card, or can alternatively be configured as a backplane, a midplane, or any suitable alternative electrical component. The first electrical connector 100 can be configured to be mounted to the first printed circuit board 300a so as to place the first electrical connector 100 in electrical communication with the first printed circuit board 300a. Similarly, the second electrical connector 200 can be configured to be mounted to the second printed circuit board 300b so as to place the second electrical connector 200 in electrical communication with the second printed circuit board 300b. The first and second electrical connectors 100 and 200 are further configured to be mated with each other along a mating direction so as to place the first electrical connector 100 in electrical communication with the second electrical connector 200. The mating direction can, for instance, define a longitudinal direction L. Accordingly, the first and second electrical connectors 100 and 200 can be mated to one another so as to place the first printed circuit board 300a in electrical communication with the second printed circuit board 300b.

The first electrical connector 100 can define a mating interface 102 and a mounting interface 104. Similarly, the second electrical connector can define a mating interface 202 and a mounting interface 204. The first electrical connector 100 and the second electrical connector 200 are configured to mate with each other at the respective mating interfaces 102 and 202. The first electrical connector 100 is configured to be mounted to the first printed circuit board 300a at the mounting interface 104. Similarly, the second electrical connector 100 is configured to be mounted to the second printed circuit board 300b at the mounting interface 104. In accordance with the illustrated embodiment, the first electrical connector 100 can be constructed as a right-angle electrical connector whereby the mating interface 102 is oriented perpendicular with respect to the mounting interface 104. Alternatively, the first electrical connector 100 can be configured as a vertical electrical connector whereby the mating interface 102 is oriented parallel with respect to the mounting interface 104. Further, in accordance with the illustrated embodiment, the second electrical connector 200 can be constructed as a right-angle electrical connector whereby the mating interface 202 is oriented perpendicular with respect to the mounting interface 204. Alternatively, the second electrical connector 200 can be configured as a vertical electrical connector whereby the mating interface 202 is oriented parallel with respect to the mounting interface 204.

As illustrated in FIG. 1, when the first electrical connector 100 is mounted to the first printed circuit board 300a, the second electrical connector 200 is mounted to the second printed circuit board 300b, and the first and second electrical connectors 100 and 200 are mated with each other, the mounting interfaces 104 and 204 are oriented orthogonal with respect to each other. Thus, it can be said that the first and second electrical connectors 100 and 200 are orthogonal with respect to each other when mated to each other. For instance, the mounting interface 104 of the first electrical connector 100 is oriented along a plane that is defined by the longitudinal direction L and a transverse direction T that is perpendicular to the longitudinal direction L. The mounting interface 204 of the second electrical connector 200 is oriented along a plane that is defined by the longitudinal direction L and a lateral direction A. The lateral direction A is oriented perpendicular to both the longitudinal direction L and the transverse direction T. Thus, the first and second printed circuit boards 300a and 300b that are mounted to the first and second electrical connectors 100 and 200, respectively, are oriented orthogonal to each other. Accordingly, the electrical connector assembly 10 can be referred to as an orthogonal connector assembly.

It should be appreciated, of course, that the electrical connector assembly 10 can be alternatively constructed in any manner as desired. For instance, the electrical connector assembly 10 can be a co-planar electrical connector assembly whereby the first and second electrical connectors 100 and 200 are constructed such that the first and second printed circuit boards 300a and 300b are oriented along planes that are each defined by the same two directions, such as the longitudinal direction L and the lateral direction A. Thus, the mounting interfaces 104 and 204 can also be defined by the same two directions that are perpendicular to each other, such as the longitudinal direction L and the lateral direction A. Alternatively still, one of the first and second electrical connectors 100 and 200 can be configured as a vertical connector, while the other of the first and second electrical connectors 100 and 200 can be configured as a right angle connector, such that the first and second printed circuit boards 300a and 300b are oriented perpendicular with respect to each other. For instance, one of the mounting interfaces 104 and 204 can be oriented in a plane defined by the lateral direction A and the transverse direction T, and the other of the mounting interfaces 104 and 204 can be oriented in a plane defined by the longitudinal direction L and the lateral direction A.

The longitudinal direction L and the transverse direction T can be oriented in a horizontal direction, and the lateral direction A can be oriented in a vertical direction, though it should be appreciated that these directions may change depending, for instance, on the orientation of the electrical connector assembly 10 during use. Unless otherwise specified herein, the terms "lateral," "longitudinal," and "transverse" as used to describe the orthogonal directional components of various components and do not limit to specific differential signal pair configurations. Further, the term "inward," "inner," "inboard," and words of similar import refer to a direction toward a center of a structure, while the terms "outward", "outer," "outboard" and words of similar import refer to a direction away from the center of the structure.

Referring again to FIGS. 1A-C, the first electrical connector 100 can include a dielectric, or electrically insulative connector housing 106 and a plurality of electrical contacts 150 that are supported by the connector housing 106. For instance, the first electrical connector 100 can include a plurality of leadframe assemblies 130 that include respective dielectric or electrically insulative leadframe housings 132 and select ones of the plurality of electrical contacts 150 supported by the leadframe housings 132. Thus, the electrical contacts 150 can be supported by respective ones of the leadframe housings 132 which, in turn, are supported by the connector housing 106. Alternatively, the electrical contacts 150 can be supported directly by the connector housing 106. The electrical contacts 150 can include electrical signal contacts 152 can be overmolded by respective ones of the leadframe housings 132, or can alternatively be stitched into the leadframe housings 132. Each of the leadframe assemblies 130 can further include a ground plate 168 that is supported by the leadframe housing 132. The ground plate 168 can be electrically conductive. The ground plate 168 can be metallic. The ground plate 168 can include an electrically conductive or nonconductive lossy material. Thus, the ground plate 168 can define a shield that reduces crosstalk between adjacent ones of the leadframe assemblies 130. The ground plate 168 can include ground mating ends 172 and ground mounting ends 174. The signal contacts 152, the ground mating ends 172, and the ground mounting ends 174 can be included in the plurality of electrical contacts 150.

The plurality of electrical contacts 150 can be referred to as a first plurality of electrical contacts with respect to the electrical connector assembly 10. The plurality of electrical contacts 150 can include a first plurality of signal contacts 152 that define respective mating ends 156 and mounting ends 158 opposite the mating ends 156. Similarly, the plurality of electrical contacts 150 can include a first plurality of ground mating ends 172 and ground mounting ends 174 opposite the ground mating ends 172. The ground mating ends 172 and ground mounting ends 174 can be monolithic with respective ones of a plurality of electrically conductive ground plates 168. Alternatively, the ground mating ends 172 and the ground mounting ends 174 can each be defined by respective individual electrical ground contacts as desired. The mating ends of the electrical contacts 150 can include the mating ends 156 and the ground mating ends 172. Similarly, the mounting ends of the electrical contacts 150 can include the mounting ends 158 and the ground mounting ends 174. The mounting ends of the electrical contacts 150 can be configured as desired so as to be placed in electrical communication with respective mounting locations of the first printed circuit board 300a. For instance, the mounting ends of the electrical contacts 150 can be configured as press-fit tails, surface mount members, or can include fusible elements such as solder balls.

The mating ends of the electrical contacts 150 of each of the leadframe assemblies 130 can be arranged and aligned along a column direction, which can be defined by the transverse direction T in accordance with the illustrated embodiment. The electrical contacts 150 can be arranged such that adjacent ones of the electrical signal contacts 152 along the column direction can define pairs 166. The leadframe assemblies 130 can be disposed adjacent each other along a row direction that is perpendicular to the column direction. The row direction can be defined by the lateral direction A. Each pair 166 of electrical signal contacts 152 can define a differential signal pair. Each of the ground mating ends 172 can be disposed adjacent mating ends 156 of the pairs of electrical signal contacts 152 along the column direction. For instance, ones of the ground mating ends 172 can be disposed between immediately adjacent ones of the pairs 166 of electrical signal contacts 166 along the column direction. Similarly, each of the ground mounting ends 174 can be disposed adjacent ones of the mounting ends 158 of the pairs 166 of electrical signal contacts 152 along respective linear arrays that are oriented in the transverse direction T.

The electrical contacts 150 can be constructed as right angle contacts, whereby the mating ends are oriented perpendicular to the mounting ends. In accordance with one embodiment, electrical contacts can be orthogonal, such that the mounting ends 158 of the signal contacts 152 of each of the pairs 166 can be spaced from each other along a select direction, which is the same direction as the direction that the mating ends 156 of the signal contacts 152 of each of the pairs 166 are spaced from each other. Thus, ones of the ground mounting ends 174 can be disposed between immediately adjacent ones of the mounting ends 158 of the pairs 166 of electrical signal contacts 166 along the select direction. Similarly, ones of the ground mating ends 172 can be disposed between immediately adjacent ones of the mating ends 156 of the pairs 166 of electrical signal contacts 166 along the select direction. Otherwise stated, the mating ends of the electrical contacts 150 of each leadframe assembly 130 can be spaced from each other in the select direction, and the mounting ends of the electrical contacts of each leadframe assembly can be spaced from each other in the select direction. The select direction can be the transverse direction T. Alternatively, the mating ends of the electrical contacts 150 of each leadframe assembly 130 can be spaced from each other in the select direction, and the mounting ends of the electrical contacts of each leadframe assembly can be spaced from each other in a second direction that is perpendicular to the select direction. For instance, the second direction can be the longitudinal direction L. The first electrical connector 100 can, for instance, be configured as described in U.S. patent application Ser. No. 13/836,610, filed Mar. 15, 2013, the disclosure of which is hereby incorporated by reference as if set forth in its entirety herein. Alternatively still, the mating ends of the electrical contacts 150 can be configured as vertical contacts, whereby the mating ends are oriented parallel to the mounting ends.

The electrical contacts 150, can include any repeating contact pattern as in each of the desired in the first direction, including S-S-G, G-S-S, S-G-S, or any suitable alternative contact pattern, where "S" represents an electrical signal and "G" represents a ground. The plurality of leadframe assemblies 130 can include at least one first leadframe assembly 130a, including a plurality of first leadframe assemblies 130a, that can each include a first repeating contact pattern. The plurality of leadframe assemblies 130 can include at least one second leadframe assembly 130b, including a plurality of second leadframe assemblies 130b, that can each include a second repeating contact pattern that is the same or different than the first repeating contact pattern. For instance, the first repeating contact pattern of G-S-S along the column direction. The outermost one of the electrical contacts 150 along the column can be a single widow contact that can be overmolded by the leadframe housing or stitched into the leadframe housing as described with respect to the electrical signal contacts 152. It should be appreciated for the purposes of clarity that reference to the signal contacts 152 includes the single widow contacts. The second repeating contact pattern can be a G-S-S pattern along the second direction, such that the outermost electrical contact 150 along the column can be a single widow contact. The single widow contact of the second leadframe assemblies 130b that is disposed opposite the widow contact of the first plurality of leadframe assemblies 130a. The single widow contacts can be single-ended signal contacts, low speed or low frequency signal contacts, power contacts, ground contacts, or some other utility contacts.

With continuing reference to FIGS. 1A-C, the second electrical connector 200 can include a dielectric, or electrically insulative connector housing 206 and a plurality of electrical contacts 250 that are supported by the connector housing 206. For instance, the second electrical connector 200 can include a plurality of leadframe assemblies 230 that include respective dielectric or electrically insulative leadframe housings 232 and select ones of the plurality of electrical contacts 250, such as signal contacts 252, supported by the leadframe housings 232. Thus, the signal contacts 252 can be supported by respective ones of the leadframe housings 232 which, in turn, are supported by the connector housing 206. Alternatively, the electrical signal contacts 252 can be supported directly by the connector housing 206. The signal contacts 252 can be overmolded by respective ones of the leadframe housings 232, or can alternatively be stitched into the leadframe housings 232. Each of the leadframe assemblies 230 can further include a ground plate 268 that is supported by the leadframe housing 232. The ground plate 268 can be electrically conductive. The ground plate 168 can be metallic. The ground plate 168 can include an electrically conductive or nonconductive lossy material. Thus, the ground plate 268 can define a shield that reduces crosstalk between adjacent ones of the leadframe assemblies 230. The ground plate 268 can include ground mating ends 272 and ground mounting ends 274. The signal contacts 252, the ground mating ends 172, and the ground mounting ends 274 can be included in the plurality of electrical contacts 250.

The plurality of electrical contacts 250 can be referred to as a second plurality of electrical contacts with respect to the electrical connector assembly 10. The plurality of electrical contacts 250 can include a second plurality of signal contacts 252 that define respective mating ends 256 and mounting ends 258 opposite the mating ends 256. Similarly, the plurality of electrical contacts 250 can include a second plurality of ground mating ends 272 and ground mounting ends 274 opposite the ground mating ends 272. The ground mating ends 272 and ground mounting ends 274 can be monolithic with respective ones of a plurality of electrically conductive ground plates 268. Alternatively, the ground mating ends 272 and the ground mounting ends 274 can each be defined by respective individual electrical ground contacts as desired. The mating ends of the electrical contacts 250 can include the mating ends 256 and the ground mating ends 272. Similarly, the mounting ends of the electrical contacts 250 can include the mounting ends 258 and the ground mounting ends 274. The mounting ends of the electrical contacts 150 can be configured as desired so as to be placed in electrical communication with respective mounting locations of the second printed circuit board 300b. For instance, the mounting ends of the electrical contacts 250 can be configured as press-fit tails, surface mount members, or can include fusible elements such as solder balls.

The mating ends of the electrical contacts 250 of each of the leadframe assemblies 230 can be arranged and aligned along a column direction, which can be defined by the transverse direction T in accordance with the illustrated embodiment. The electrical contacts 250 can be arranged such that adjacent ones of the electrical signal contacts 252 along the column direction can define pairs 266. The leadframe assemblies 230 can be disposed adjacent each other along a row direction that is perpendicular to the column direction. The row direction can be defined by the lateral direction A. Each pair 266 of electrical signal contacts 252 can define a differential signal pair. Each of the ground mating ends 272 can be disposed adjacent mating ends 156 of the pairs of electrical signal contacts 252 along the column direction. For instance, ones of the ground mating ends 272 can be disposed between immediately adjacent ones of the pairs 266 of electrical signal contacts 266 along the column direction. Similarly, each of the ground mounting ends 274 can be disposed adjacent ones of the mounting ends 258 of the pairs 266 of electrical signal contacts 252 along respective linear arrays that are oriented in a direction that is perpendicular to the column direction. For instance, the linear array direction can be the longitudinal direction L.

The electrical contacts 250 can be constructed as right angle contacts, whereby the mating ends are oriented perpendicular to the mounting ends. For instance, the mating ends of the electrical contacts 250 of each leadframe assembly 230 can be spaced from each other in a select direction, and the mounting ends of the electrical contacts 250 of each leadframe assembly 230 can be spaced from each other in a second direction that is perpendicular to the select direction. For instance, the select direction can be the transverse direction T. The second direction can be the longitudinal direction L. Alternatively, the electrical contacts 250 can be orthogonal as described above with respect to the electrical contacts 150. Alternatively still, the mating ends of the electrical contacts 150 can be configured as vertical contacts, whereby the mating ends are oriented parallel to the mounting ends. The second electrical connector 200 can, for instance, be configured as described in U.S. patent application Ser. No. 13/836,610, filed Mar. 15, 2013, the disclosure of which is hereby incorporated by reference as if set forth in its entirety herein.

The electrical contacts 250, can define any repeating contact pattern as in each of the desired in the first direction, including S-S-G, G-S-S, S-G-S, or any suitable alternative contact pattern, where "S" represents an electrical signal and "G" represents a ground. The plurality of leadframe assemblies 230 can include at least one first leadframe assembly 230a, including a plurality of first leadframe assemblies 230a, that can each define a first repeating contact pattern. The plurality of leadframe assemblies 230 can include at least one second leadframe assembly 230b, including a plurality of second leadframe assemblies 230b, that can each define a second repeating contact pattern that is the same or different than the first repeating contact pattern. For instance, the first repeating contact pattern of G-S-S along the column direction. The outermost electrical contact 250 along the column can be a single widow contact that can be overmolded by the leadframe housing or stitched into the leadframe housing as described with respect to the electrical signal contacts 252. It should be appreciated for the purposes of clarity that reference to the signal contacts 252 includes the single widow contacts. The second repeating contact pattern can be a G-S-S pattern along the second direction, such that the outermost electrical contact 250 along the column can be a single widow contact. The single widow contact of the second leadframe assemblies 230b that is disposed opposite the widow contact of the first plurality of leadframe assemblies 230a. The single widow contacts can be single-ended signal contacts, low speed or low frequency signal contacts, power contacts, ground contacts, or some other utility contacts.

Referring again to FIG. 1 the first and second connectors 100 and 200 are configured to mate directly to each other at their respective mating interfaces 102 and 202. Accordingly, the electrical contacts 150 and 250 can mate directly to each other. Thus, the electrical contacts 150 and 250 physically and electrically connect to each other at their respective mating ends. That is, the mating ends 156 and mating ends 256 physically touch each other when the first and second electrical connectors 100 and 200 are mated to each other. Further, the ground mating ends 172 and 272 physically touch each other when the first and second electrical connectors 100 and 200 are mated to each other. In accordance with one embodiment, the electrical contacts 150 of the first leadframe assemblies 130a mate with respective ones of the electrical contacts 250 of the first leadframe assemblies 230a. Similarly, the electrical contacts 150 of the second leadframe assemblies 130b mate with respective ones of the electrical contacts 250 of the second leadframe assemblies 230b.

Figure 2:
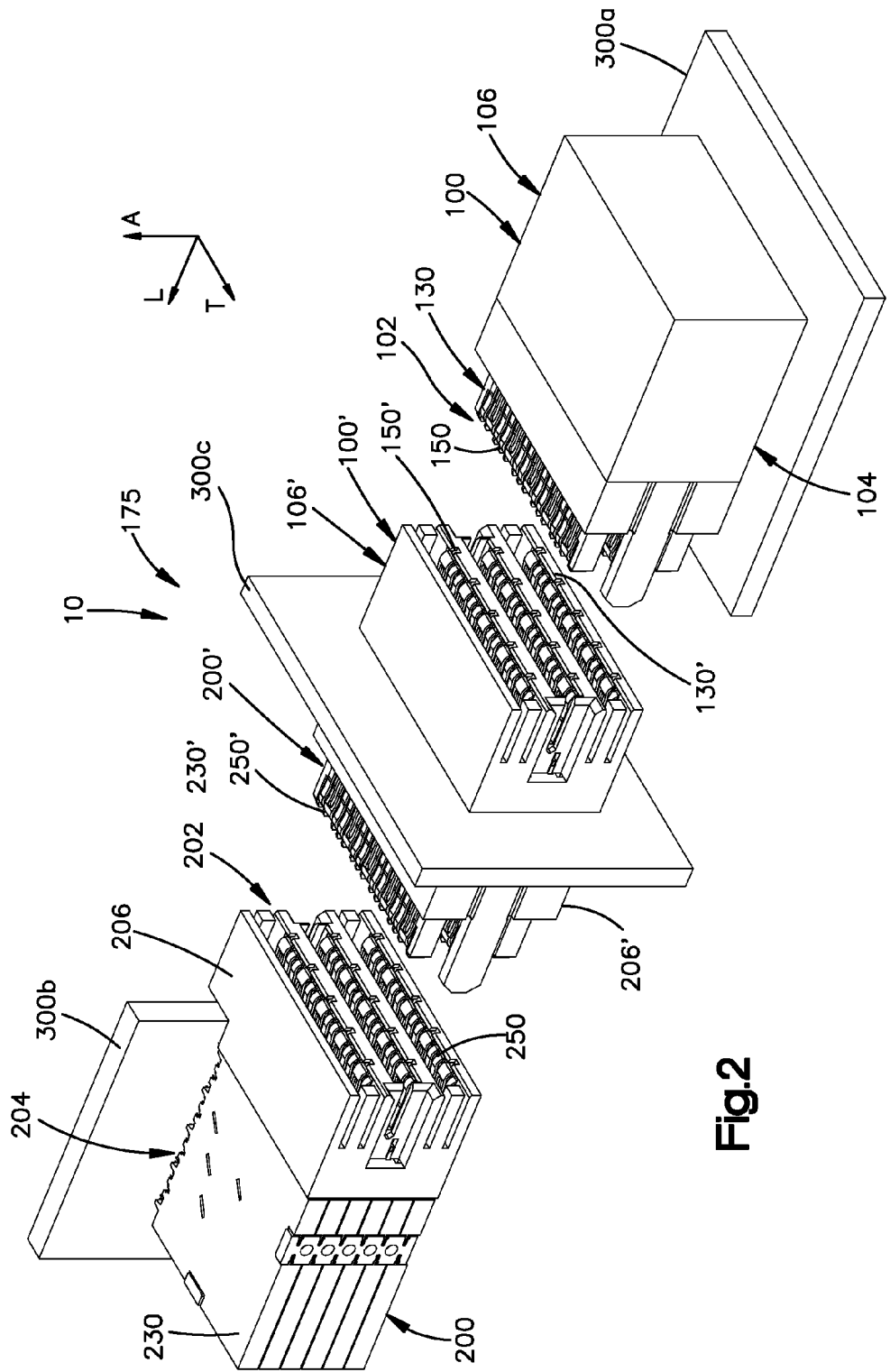
FIG. 2 is a perspective view of the electrical connector assembly electrical connector assembly as illustrated in FIG. 1, but further including a midplane assembly, wherein the first and second electrical connectors are configured to be mated to each other through the midplane assembly.

Alternatively, as illustrated in FIG. 2, the first and second electrical connectors 100 and 200 can mate with each other indirectly. Thus, the electrical contacts 150 and 250 can be placed in electrical communication with each other without physically touching each other. In accordance with one embodiment, electrical connector assembly 10 can include a midplane assembly 175 that is configured to directly mate with each of the first and second electrical connector 100 and 200 so as to place the respective electrical contacts 150 and 250 in electrical communication with each other. The midplane assembly 175 can include a third substrate, which can be configured as a third printed circuit board 300c. The third printed circuit board 300c can provide a midplane of the midplane assembly 175. The midplane assembly 175 can further include first and second midplane electrical connectors 100' and 200', which can be vertical electrical connectors, each configured to be mounted to the third printed circuit board 300c so as to be placed in electrical communication with each other through the midplane. For instance, the first midplane electrical connector 100' can be mounted to a first side of the midplane, and the second midplane electrical connector 200' can be mounted to a second side of the midplane that is opposite the first side, for instance along the longitudinal direction L. The first midplane electrical connector 100' is configured to mate with the first electrical connector 100, and the second midplane electrical connector 200' is configured to mate with the second electrical connector 200 so as to place the first and second electrical connectors 100 and 200 in electrical communication with each other through the midplane assembly 175. The first and second midplane electrical connectors 100' and 200' can be constructed in accordance with any embodiment described herein with respect to first and second electrical connectors 100 and 200, unless otherwise indicated. For instance, the first and second electrical connectors 100' and 200' can include respective leadframe assemblies 130' and 230' as described above. The mounting ends of the electrical contacts 150' and 250' of the first and second midplane electrical connectors 100' and 200' extend into opposite ends of common vias that extend through the midplane so as to electrically connect the first and second midplane electrical connectors 100' and 200' to each other through the midplane.

Figure 3A:
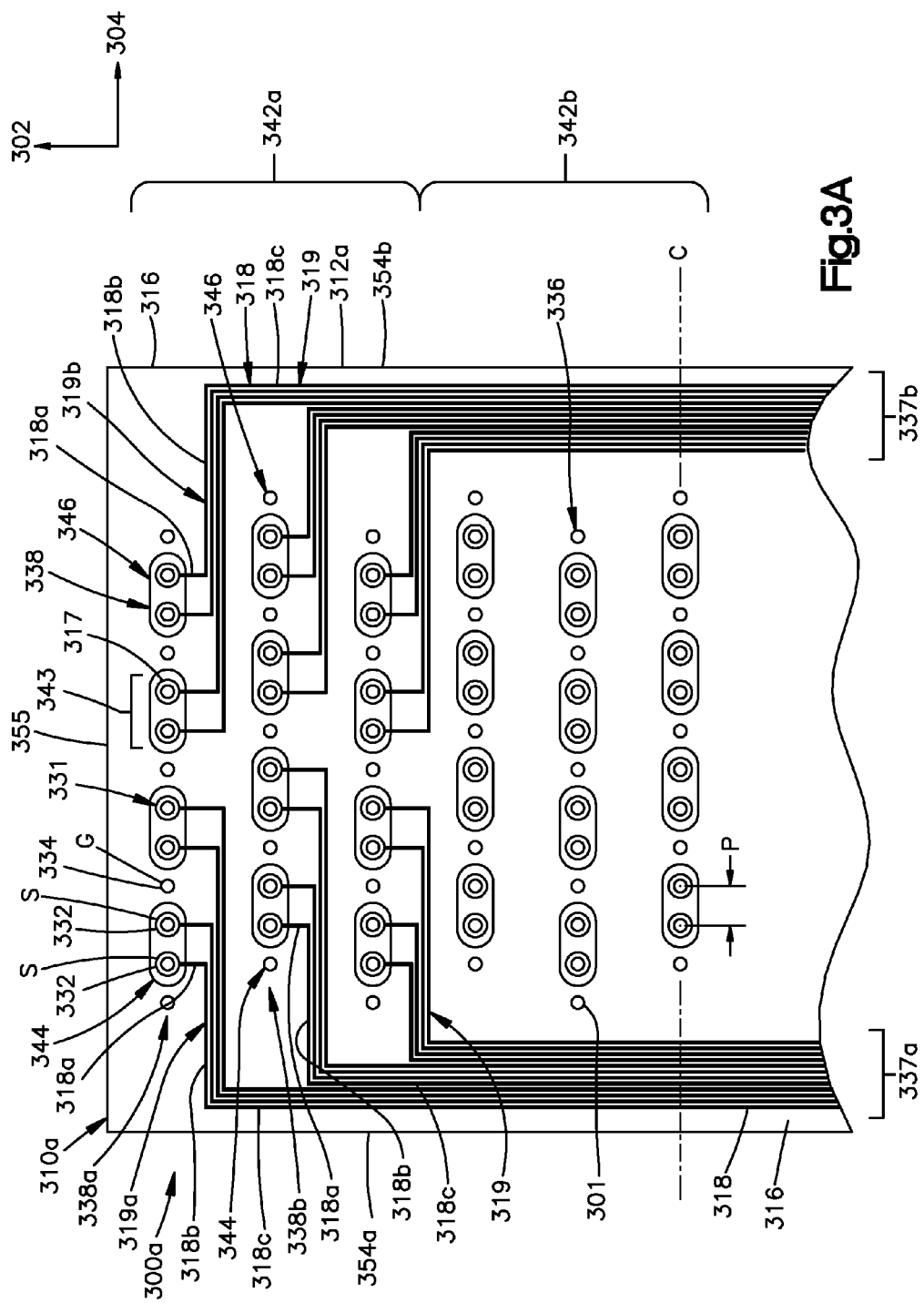
FIG. 3A is a top plan view of a first section of a printed circuit board constructed in accordance with one embodiment.
Figure 3B:
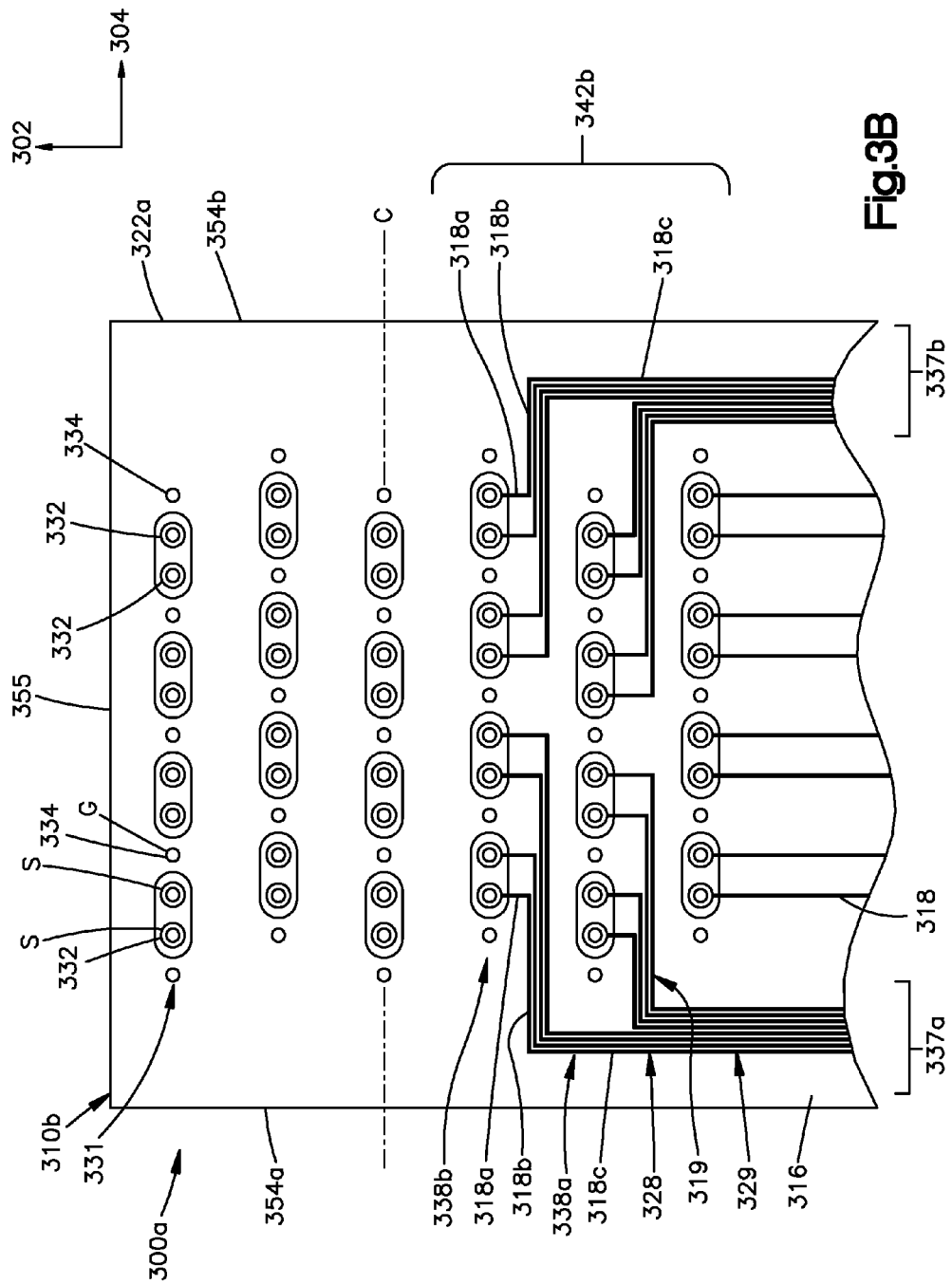
FIG. 3B is a top plan view of a second section of the printed circuit board illustrated in FIG. 3A.

Referring now to FIGS. 3A-3C, a printed circuit board, which can be the first printed circuit board 300a illustrated in FIGS. 1A-2, be configured as a daughter card or alternatively constructed circuit board that is configured to be placed in electrical communication with the electrical contacts 150 of the complementary first electrical connector 100 that is mounted to the printed circuit board 300a. For instance, the printed circuit board 300a can include a dielectric or electrically insulative material, such as such as glass-filled or glass impregnated epoxy, electrical signal mounting locations supported by the electrically insulative material, and electrical ground mounting locations supported by the electrically insulative material. The signal mounting locations are configured to be placed in electrical communication with mounting portions of electrical signal contacts of the complementary electrical connector, and the ground mounting locations are configured to be placed in electrical communication with mounting portions of electrical ground contacts of the complementary electrical connector. For instance, the signal mounting portions can be configured as signal vias S that define respective electrically plated holes, and the ground mounting portions can be configured as ground vias G that define respective electrically plated holes. The signal vias S are configured to receive press-fit tails of electrical signal contacts of the complementary electrical connector, and the ground vias G are configured to receive press-fit tails of electrical ground contacts of the complementary electrical connector. It should be appreciated that the signal mounting portions and ground mounting portions can alternatively be configured as contact pads that are configured to be placed in contact with the respective mounting portions of the signal contacts and ground contacts of the complementary electrical connector that are surface mounted to the contact pads. The signal mounting portions are in electrical communication with respective signal traces 318 that are configured to route electrical signals along the printed circuit board 300a.

In accordance with the illustrated embodiment, the printed circuit board 300a can be generally planar along a first direction 302 and a second direction 304 that is perpendicular with respect to the first direction 302. For instance, when the first electrical connector 100 is an orthogonal electrical connector and mounted to the printed circuit board 300a, the first direction 302 can be the longitudinal direction L, and the second direction 304 can be the transverse direction T. When the first electrical connector 100 is a right-angle connector, the first direction 302 can be the longitudinal direction L, and the second direction 304 can be the lateral direction A. When the first electrical connector 100 is a vertical electrical connector, the first direction 302 can be the lateral direction A, and the second direction 304 can be the transverse direction T.

The printed circuit board 300a has a length that extends along the first direction 302 and a width that extends along the second direction 304. The length 302 can be equal to, greater than, or less than, the width 304. The printed circuit board 300a further has a thickness that extends along a third direction 306 that is perpendicular to each of the first direction 302 and the second direction 304.

The printed circuit board 300a can include at least a first section 310a illustrated in FIG. 3A, and a second section 310b. The first section 310a can include at least one electrically conductive layer 312, such as a plurality of electrically conductive layers 312. The electrically conductive layers 312 can include a first electrically conductive layer 312a and a second electrically conductive layer 312b. In one embodiment, the first and second conductive layers 312a and 312b can be consecutive electrically conductive layers. Thus, the second electrically conductive layer 312b can be disposed below the first electrically conductive layer 312a along the third direction 306. Accordingly, the first electrically conductive layer 312a can be referred to as an upper electrically conductive layer, and the second electrically conductive layer 312b can be referred to as a lower electrically conductive layer. Each of the first and second electrically conductive layers 312a and 312b can be substantially planar along respective planes that are defined by the first and second directions 302 and 304.

The first electrically conductive layer 312a can be configured as an electrical signal layer, and the second electrically conductive layer 312b can be configured as an electrically conductive ground layer. Because the first electrically conductive layer 312a is included in the first section 310a of the printed circuit board 300a, the first electrically conductive layer 312a can be referred to as a first electrical signal layer. Similarly, because the second electrically conductive layer 312b is included in the first section 310a of the printed circuit board 300a, the second electrically conductive layer 312b can be referred to as a first electrical ground layer. The first electrical signal layer 312a can include an electrically insulative material 316, and at least one electrical signal trace 318, such as a plurality of electrical signal traces 318, supported by the electrically insulative material. Differential signal traces of each pair are preferably spaced closer to each other than a spacing between immediately adjacent pairs of differential signal traces. For instance, the first electrical signal layer 312a can define a plurality of routing channels 319 that each contain at least a select one, such as select plurality, of the electrical signal traces 318. The first electrical ground 312b can include an electrically conductive material that can be disposed between electrical signal layers so as to provide shielding between the electrical signal layers. The electrically conductive material of the first electrical ground layer 312b can be copper or any suitable alternative electrically conductive material.

The printed circuit board 300a can further include at least one dielectric or electrically insulative layer 314, such as a plurality of dielectric or electrically insulative layers 314 that are alternatingly arranged with the electrically conductive layers 312 along the third direction 306. Thus, the electrically insulative layers 314 are configured to electrically isolate two immediately adjacent ones of the consecutive conductive layers 312 from one another. The dielectric layers 314 may be comprised of any suitable electrically insulative material, such as such as glass-filled or glass impregnated epoxy, that prevents the flow of electricity therethrough. The electrically insulative layers 314 can include a first electrically insulative layer 314a and a second electrically insulative layer 314b. The first and second electrically insulative layers 314a and 314b can be arranged consecutively along the third direction. Thus, the second electrically insulative layer 314b can be disposed below the first electrically insulative layer 314a along the third direction 306. Accordingly, the first electrically insulative layer 314a can be referred to as an upper electrically insulative layer, and the second electrically insulative layer 314b can be referred to as a lower electrically insulative layer. Each of the first and second electrically insulative layers 314a and 314b can be substantially planar along respective planes that are defined by the first and second directions 302 and 304.

The electrically conductive layers 312 and the electrically insulative layers 314 can be alternatingly arranged with respect to each other along the third direction 306. Thus, the first electrically insulative layer 314a can be disposed between the first electrically conductive layer 312a and the second electrically conductive layer 312b. The second electrically conductive layer 312b can be disposed between the first electrically insulative layer 314a and the second electrically insulative layer 314b.

Similarly, the second section 310b can include at least one electrically conductive layer 322, such as a plurality of electrically conductive layers 322. The electrically conductive layers 322 can include a third electrically conductive layer 322a and a fourth electrically conductive layer 322b. In one embodiment, the third and fourth electrically conductive layers 322a and 322b can be consecutive electrically conductive layers. Thus, the fourth electrically conductive layer 322b can be disposed below the third electrically conductive layer 322a along the third direction 306. Accordingly, the third electrically conductive layer 322a can be referred to as an upper electrically conductive layer of the second section 310b, and the fourth electrically conductive layer 322b can be referred to as a lower electrically conductive layer of the second section 310b. Each of the third and fourth electrically conductive layers 322a and 322b can be substantially planar along respective planes that are defined by the first and second directions 302 and 304.

The third electrically conductive layer 322a can be configured as an electrical signal layer, and the fourth electrically conductive layer 322b can be configured as an electrically conductive ground layer. Because the third electrically conductive layer 322a is included in the second section 310b of the printed circuit board 300a, the third electrically conductive layer 322a can be referred to as a second electrical signal layer. Similarly, because the fourth electrically conductive layer 322b is included in the second section 310b of the printed circuit board 300a, the fourth electrically conductive layer 322b can be referred to as a second electrical ground layer. The second electrical signal layer 322a can include an electrically insulative material 326, and at least one electrical signal trace 318, such as a plurality of electrical signal traces 318, supported by the electrically insulative material. For instance, the second electrical signal layer 322a can define a plurality of routing channels 319 that each contain at least a select one, such as select plurality, of the electrical signal traces 318. The second electrical ground 322b layer can include any suitable electrically conductive material. For instance, the electrically conductive material of the second electrical ground 322b can be copper or any suitable alternative electrically conductive material.

The printed circuit board 300a can further include at least one dielectric or electrically insulative layer 324, such as a plurality of dielectric or electrically insulative layers 324 that are alternatingly arranged with the electrically conductive layers 322 along the third direction 306. Thus, the electrically insulative layers 324 are configured to electrically isolate two immediately adjacent ones of the consecutive conductive layers 322 from one another. The dielectric layers 324 may be comprised of any suitable electrically insulative material, such as such as glass-filled or glass impregnated epoxy, that prevents the flow of electricity therethrough. The electrically insulative layers 324 can include a third electrically insulative layer 324a and a fourth electrically insulative layer 324b The third and fourth electrically insulative layers 324a and 324b can be arranged consecutively along the third direction 306, such that the fourth electrically insulative layer 324b can be disposed below the third electrically insulative layer 324a along the third direction 306. Accordingly, the third electrically insulative layer 324a can be referred to as an upper electrically insulative layer of the second section 310b, and the fourth electrically insulative layer 324b can be referred to as a lower electrically insulative layer of the second section 310b. Each of the third and fourth electrically insulative layers 324a and 324b can be substantially planar along respective planes that are defined by the first and second directions 302 and 304.

The electrically conductive layers 312 and the electrically insulative layers 314 can be alternatingly arranged with respect to each other along the third direction 306. Thus, the third electrically insulative layer 324a can be disposed between the third electrically conductive layer 322a and the fourth electrically conductive layer 322b. The fourth electrically conductive layer 322b can be disposed between the third electrically insulative layer 324a and the fourth electrically insulative layer 324b.

Description of the printed circuit board 300a below can pertain to both the first section 310a and the second section 310b, including the respective electrically conductive layers and the respective electrically insulative layers, unless otherwise indicated as specific to one of the first and second sections 310a and 310b. The width of the printed circuit board 300a can extend along the second direction 304 from a first side edge 354a to a second side edge 354b. The printed circuit board 300a can further include a card edge 355 that extends along the second direction between the first side edge 354a and the second side edge 354b. For instance, the card edge 355 can extend along the second direction from the first side edge 354a to the second side edge 354b. In accordance with the illustrated embodiment, the card edge 355 can define the card edge 333 illustrated in FIG. 1A.

As described above, the printed circuit board 300a can define a plurality of mounting locations 301 that are configured to be placed in electrical communication with respective mounting ends of the electrical contacts 150 of the electrical connector 100. For instance, the mounting locations 301 can be configured as a plurality vias 331. The vias 331 can include electrical signal vias 332 and electrical ground vias 334. Each of the signal vias 332 and ground vias 334 can be configured as an electrically plated through hole. The signal vias 332 are configured to receive respective ones of the mounting ends 158 of the electrical signal contacts 152 so as to place the electrical signal contacts 152 in electrical communication with the respective signal vias 332. Similarly, the ground vias 334 are configured to receive respective ones of the ground mounting ends 157 so as to place the electrical signal contacts 152 in electrical communication with the ground plate 168 or individual ground contacts. It should be appreciated that while the signal vias 332 and ground vias 334 are configured to receive selective ones of the electrical contacts 150 of the first electrical connector 100, the signal vias 332 and the ground vias 334 can alternatively be configured to receive mounting ends of respective signal contacts and ground contacts of an auxiliary connector that is mounted to the printed circuit board 300a such that the printed circuit board 300a places the first electrical connector 100 in electrical communication with the auxiliary electrical connector. For instance, the first electrical connector 100 can be mounted proximate to one card edge 333, and the auxiliary connector can be mounted proximate to a second card edge 335 that is different than the first card edge 333. For instance, the second card edge 335 can be opposite the card edge 333. The card edges 333 and 335 can each extend between the first side edge 354a and a second side edge 354b along the second direction 304, or can be located in any respective suitable alternatively locations of the printed circuit board 300a.

The signal vias 332 and the ground vias 334 can collectively be referred to as vias 331. It should be appreciated that reference herein to vias 331 can alternatively apply to the mounting locations 301 constructed in accordance with any suitable embodiment, unless otherwise indicated. The mounting locations 301 can be defined by the first electrically conductive layer 312a. For instance, the vias 331, and thus the mounting locations 301, can be defined in a footprint 336 that includes a plurality of linear arrays 338 that can extend along the second direction 304. Because the card edge 355 of the first printed circuit board 300a can define the card edge 333 illustrated in FIG. 1A, the first electrical connector 100 can be mounted at the footprint 336 such that the mounting ends of the first electrical connector 100 are inserted into respective ones of the vias 331 that define the footprint 336. Thus, the linear arrays 338 extend parallel to the card edge 355, and can define differential pairs of signal vias as is described in more detail below. A center line that extends centrally through the vias 331 of each of the linear arrays 338 can extend along the second direction 304 and parallel to the card edge 355. The linear arrays 338 can be spaced from each other along the first direction 302. The linear arrays 338 can include a first plurality of linear arrays 338a and a second plurality of linear arrays 338b. The footprint 336 can be disposed proximate to the card edge 355. For instance, the footprint 336 can be spaced from the card edge 355 a distance that is less than the distance between opposed outermost ones of the linear arrays 338 along the first direction. It should be appreciated that the footprint 336 can alternatively be spaced from the card edge at any distance as desired.

The printed circuit board 300a can define a first margin or routing channel 337a that can be devoid of mounting locations 301. The first margin 337a can extend between the first side edge 354a and the footprint 336 along the second direction 304 or between the footprint 336 and an immediately adjacent footprint. Similarly, the printed circuit board 300a can define a second margin 337b that is devoid of by mounting locations 301. The second margin or routing channel 337b can extend between the second side edge 354b and the footprint 336 along the second direction 304. Alternatively, the first and second margins 337a and 337b can define mounting locations that are not included in the footprint 336 of vias 331.

The linear arrays of the first plurality of linear arrays 338a can be offset along the second direction 304 with respect to the linear arrays of the second plurality of linear arrays 338b. For instance, adjacent ones of the vias 331 of the respective linear arrays 338 can be spaced center-to-center along the second direction at a distance or pitch P. The linear arrays of the first plurality of linear arrays 338a can be offset along the second direction 304 with respect to the linear arrays of the second plurality of linear arrays 338b a distance equal to the pitch P. The first margin 337a can define a first areas that are inline with the first plurality of linear arrays 338a along the second direction 304, and second areas that are inline with the second plurality of linear arrays 338b. The first margin 337a at the first areas can have a distance along the second direction 304 that is less than the distance of the first margin 337a at the second areas along the second direction 304. Alternatively, the first margin 337a at the first areas can have a distance along the second direction 304 that is greater than the distance of the first margin 337a at the second areas along the second direction 304. The second margin 337b can define a first areas that are inline with the first plurality of linear arrays 338a along the second direction 304, and second areas that are inline with the second plurality of linear arrays 338b. The second margin 337b at the first areas can have a distance along the second direction 304 that is greater than the distance of the first margin 337a at the second areas along the second direction 304. Alternatively, the second margin 337b at the first areas can have a distance along the second direction 304 that is less than the distance of the first margin 337a at the second areas along the second direction 304.

Further, each of the first and second pluralities of linear arrays 338a and 33b can include a respective repeating linear array pattern of ground vias 332 and signal vias 334 along the second direction 304, which can be referred to as a linear array direction. Each of the first plurality of linear arrays 338a can include a first repeating linear array pattern along the linear array direction. Each of the second plurality of linear arrays 338b can include a second repeating linear array pattern along the linear array direction. For instance, the first linear array pattern can include one or more of a repeating S-S-G-G configuration, a repeating S-S-G configuration, a repeating S-G configuration, a repeating S-G-S configuration, a repeating G-S-S configuration, a repeating G-S-S-G configuration, a repeating G-S-G-S configuration and a repeating G-S-G-S configuration, where "S" refers to a signal via 334, and "G" refers to a ground via 332. For instance, the second linear array pattern can include one or more of a repeating S-S-G-G configuration, a repeating S-S-G configuration, a repeating S-G configuration, a repeating S-G-S configuration, a repeating G-S-S configuration, a repeating G-S-S-G configuration, a repeating G-S-G-S configuration and a repeating G-S-G-S configuration, where "S" refers to a signal via 334, and "G" refers to a ground via 332. The first linear array pattern can be the same as or different than the second linear array pattern. Adjacent signal vias 332 along the linear array direction of each of the first and second pluralities of linear arrays 338a and 338b can define a differential signal pair 343 of vias. Adjacent ones of the differential signal pairs 343 can be separated from each other along the linear array direction by a ground via 334.

Each of the first and second pluralities of linear arrays 338a and 338b can define a length along the second direction 304, and the respective first and second linear array patterns can repeat along the length of the corresponding linear array. The length can extend from one of the outermost vias of the respective linear array 338 along the linear array direction to the other one of the outermost vias of the respective linear array 338 along the linear array direction. The length of the linear arrays of the first plurality of linear arrays 338a can be equal to, greater than, or less than, the length of the linear arrays of the second plurality of linear arrays 338b. For one electrical connector, the respective lengths of the linear arrays 338 can be less than the width of the printed circuit board 300a. Because the footprint 336 can include each of the linear arrays 338, the footprint 36 can extend along an area that is defined by the first direction 302 and the second direction 304. The first and second linear arrays 338a and 338b can be alternatingly arranged along the first direction 302.

The vias 331 of each of the linear arrays 338 can also be centered with respect to a respective array center line. For example, each array center line C can extend along the second direction 304 centrally through each of the vias of the respective one of the linear arrays. Adjacent ones of the linear arrays 338 can be spaced from each other along the first direction 302 by a gap 340. Further, as will be described in more detail below, the footprint 336 of vias 331 can be arranged in a first group 342a of linear arrays 338 and a second group 342b of linear arrays 338. Each of the first and second groups 342a and 342b can include at least one of the first linear arrays 338a and at least one of the second linear arrays 338b. For instance, each of the linear arrays 338 of the first group 342a can be spaced a respective first distance from the card edge 355 along the first direction 302, and each of the linear arrays of the second group 342b can be spaced a respective second distance from the card edge 355 along the first direction 302. Each of the first distances can be less than each of the second distances. It should be appreciated that each of the second distances can alternatively be less than each of the first distances. It should be further appreciated, in accordance with another embodiment, that at least one of the first distances can be greater or less than at least one of the second distances.

Each of the vias 331 can define a respective hole 317 that extends along the third direction 306 at least partially through the printed circuit board 300a. Each hole 317 can be at least partially plated, including fully plated, with a conductive surface, such that each of the vias 331 can be referred to as a plated through-hole. Alternatively or additionally, each of the holes 317 can be partially filled with a conductive metal. Thus, each of the vias 331 can be referred to as an electrically conductive via. Further, each hole 317 can have a size and shape that is configured to receive a respective one of a the mounting ends of the plurality of electrical contacts of the complementary electrical connector that is mounted to the printed circuit board 300a, such as the first electrical connector 100 or the auxiliary electrical connector. Each of the vias 331 can have a circular cross sectional shape, though it will be appreciated that they can assume a wide variety of shapes. Each hole 317 of the circular ground vias 334 and signal vias 332 may have a diameter which that extends in a plane that is defined by the first and second direction 302 and 304.

The ground vias 334 can be electrically coupled to, and thus can be in electrical communication with, one or more of the first and second electrical ground layers 312b and 322b. For instance, the ground vias 332 of the first group 342a can be electrically coupled to the first electrical ground layer 312b. For instance, the electrically conductive material of the first electrical ground layer 312b can contact an electrically conductive surface of the ground vias 334 of the first group 342a of vias 331. Additionally or alternatively, the ground vias 332 of the first group 342a can be electrically coupled to the second electrical ground layer 322b. For instance, the electrically conductive material of the second electrical ground layer 322b can contact an electrically conductive surface of the ground vias 334 of the first group 342a of vias 331. Similarly, the ground vias 332 of the second group 342b can be electrically coupled to the second electrical ground layer 322b. For instance, the electrically conductive material of the second electrical ground layer 322b can contact an electrically conductive surface of the ground vias 334 of the second group 342b of vias 331. Additionally or alternatively, the ground vias 332 of the second group 342b can be electrically coupled to the first electrical ground layer 312b. For instance, the electrically conductive material of the first electrical ground layer 312b can contact an electrically conductive surface of the ground vias 334 of the second group 342b of vias 331.

As described above, the first electrical signal layer 312a can include a plurality of electrical signal traces 318. For instance, the first electrical signal layer 312a can include at least one routing channel 319 that contains at least one electrical signal trace 318. In accordance with one embodiment, the first electrical signal layer 312a can include a plurality of routing channels 319 that each contain a plurality of electrical signal traces 318. The electrical signal traces 318 of the first electrical signal layer 312a can be electrically coupled, that is in electrical communication with, respective ones of the signal vias 332 of the first group 342a of vias 331. For example, each of the electrical signal traces 318 can contact an electrically conductive surface of a respective one of the signal vias 332 of the first group 342a of vias 331. The electrical signal traces 318 of the second electrical signal layer 322a can be electrically coupled, that is in electrical communication with, respective ones of the signal vias 332 of the second group 342b of vias 331. For example, the electrical traces 318 of the second electrical signal layer 322a can contact an electrically conductive surface of a respective one of the signal vias 332 of the second group 342b of vias 331.

As described above, the second group 342b can include at least one first linear array 338a and at least one second linear array 338b alternatingly arranged and offset from each other with respect to the second direction 304. At least a portion of the second group 342b of linear arrays 338 can be offset with respect to the first group 342a of linear arrays 338. For instance an entirety of the second group 342b of the linear arrays 338 can be offset with respect to the first group 342a of linear arrays 338. For instance, the first group 342a of linear arrays 338 can be spaced a first distance from the card edge 355 along the first direction 302, the second group 342b of linear arrays 338 can be spaced a second distance from the card edge 355 along the first direction 302, and the second distance is greater than the first distance. The signal traces 318 in electrical communication with the signal vias 332 of the second group 342b are disposed in the second electrical signal layer 322a.

Each of the linear arrays 338 can include a first portion 344 and a second portion 346 spaced from the first portion 344 along the second direction. For instance, the first portions 344 of the respective linear arrays can be spaced a first distance from the first side edge 354a or an immediately adjacent footprint along the second direction 304 that is less than a second distance at which the second portions 346 are spaced from the first side edge 354a or an immediately adjacent footprint along the second direction 304. For example, in accordance with one embodiment, the first portion 344 of each of the linear arrays 338 can at least partially define the first margin 337a, for instance in combination with the first side edge 354a. The second portions 346 of the respective linear arrays can be spaced a first distance from the second side edge 354b along the second direction 304 that is less than a second distance at which the first portions 342 are spaced from the second side edge 354b along the second direction 304. For example, in accordance with one embodiment, the second portion 346 of each of the linear arrays 338 can at least partially define the second margin 337b, for instance in combination with the second side edge 354b. The first portions 344 can define at least one signal via 332, such as at least one differential pair of signal vias 332. The second portions 346 can also define at least one signal vias 332, such as at least one differential pair of signal vias 332.

As described above, various ones of the signal traces 318 can be disposed in respective routing channels 319. For instance, the printed circuit board 300a can include a plurality of first routing channels 319a operatively associated with the respective select ones of the first portions 344 of the first and second linear arrays 331a and 331b. Thus, the electrical traces 318 disposed in the first routing channels 319a can be electrically coupled to respective ones of the signal vias 332 of the respective select ones of the first portions 344 of the first and second linear arrays 331a and 331b. The first portions 344 of the first and second linear arrays 331a and 331b can include at least one differential signal pair of vias 332. For instance, the first portions 344 can include a first and second differential signal pairs of vias 332 that are separated by a ground via 334 along the second direction 304. Thus, the first routing channels 319a can include four signal traces 318 that are in electrical communication with respective ones of the four signal vias 332 that define the first and second differential signal pairs of vias 332. It should be appreciated that the first portions 344 of the linear arrays 331 can include any number of signal vias 332 as desired. Further, the first portions 344 of the first plurality of linear arrays 331a can have the same or a different number of signal vias 332 with respect to the number of signal vias 332 of the second plurality of linear arrays 331b of the first portion 344.

Each of the signal traces 318 can define a first end 318a that is electrically connected to a respective one of the signal vias 332 of the first portion 344 of each of the linear arrays 338. For instance, the first end 318a can be physically coupled to the electrically conductive material of the respective ones of the signal vias 332. The first ends 318a can extend along the first direction 302. The signal traces 318 can further include a first region 318b that extends relative to the first end 318a along the second direction 304. For instance, the first region 318b can extend from the first end 318a. The signal traces 318 can further include a second region 318c that extends relative to the first region 318b along a direction that is angularly offset with respect to the second direction 304. For instance, the second regions 318c can extends along the first direction 302. The second regions 318c can extend from the first regions 318b. The second regions 318c of the signal traces 318 that are in electrical communication with the respective signal vias of the first portions 346 of the linear arrays 338 can be disposed in the first margin 337a.

A portion, for instance a portion of the second region 318c, of the signal traces 318 in electrical communication with respective ones of the signal vias 332 of the second group 342b of linear arrays 338 can be aligned along the third direction 306 with a portion, for instance a portion of the second region 318c, of the signal traces 318 in electrical communication with respective ones of the signal vias 332 of the first group 342a of the linear arrays 338.

It should be appreciated that the signal traces 318 can include a first signal trace that is connected to a first signal via of one of the first linear arrays 338a, and the signal traces 318 can include a second signal trace that is connected to a second signal via of one of the second linear arrays 338b. For instance the one of the first linear arrays and the one of the second linear arrays can be adjacent linear arrays along the first direction. The first region of the first signal trace can be disposed between the first and second linear arrays 338a and 338b. The second region of the first signal trace in electrical communication with the first portion 344 of the linear arrays 338 can be disposed in the first margin 337a. Similarly, the second region of the second signal trace in electrical communication with the first portion 344 of the linear arrays 338 can be disposed in the first margin 337a. For instance, the signal traces 318 can include a first plurality of electrical signal traces 318, in electrical communication with the first portions 344 of the linear arrays 338, that includes the first signal trace, and a second plurality of electrical signal traces 318, in electrical communication with the first portions 344 of the linear arrays 338, that includes the second signal trace. The first ends 318a of each of the first plurality of signal traces 318 are attached to a respective one of the first signal vias of the first linear array 338a. Thus, the printed circuit board 300a can include a first signal channel that includes the first plurality of signal traces. The printed circuit board 300a can include a second signal channel that includes the second plurality of signal traces.

Each of the first plurality of signal traces 318 can be nested. Thus, the first regions 318b of inner ones of the signal traces 318 of the first plurality of signal traces 318 can be disposed inward with respect to the first regions 318b of outer ones of the signal traces 318 of the first plurality of signal traces 318 with respect to the first direction 302. Similarly, the second regions 318c of inner ones of the signal traces 318 of the first plurality of signal traces 318 can be disposed inward with respect to the second regions 318c of outer ones of the signal traces 318 of the first plurality of signal traces 318 with respect to the second direction 304. Each of the second plurality of signal traces 318 can be nested. Thus, the first regions 318b of inner ones of the signal traces 318 of the second plurality of signal traces 318 can be disposed inward with respect to the first regions 318b of outer ones of the signal traces 318 of the second plurality of signal traces 318 with respect to the first direction 302. Similarly, the second regions 318c of inner ones of the signal traces 318 of the second plurality of signal traces 318 can be disposed inward with respect to the second regions 318c of outer ones of the signal traces 318 of the second plurality of signal traces 318 with respect to the second direction 304. Further, the second plurality of signal traces 318 can be nested within the first plurality of signal traces 318. Thus, the first regions 318b of all of the second plurality of signal traces 318 can be disposed inward with respect to the first regions 318b of all of the signal traces 318 of the first plurality of signal traces 318 with respect to the first direction 302. Similarly, the second regions 318c of all of the second plurality of signal traces 318 can be disposed inward with respect to the second regions 318c of all of the first plurality of signal traces 318 with respect to the second direction 304.

The first ends 318a and at least a portion of the first regions 318b of select ones of the signal traces 318 can be disposed adjacent linear arrays 338 along the first direction. For instance, the first ends 318a and a majority of the first regions 318b of each of the first plurality of signal traces 318 can be disposed between adjacent ones of the first and second linear arrays 338a and 338b. As described above, the second regions 318c can extend relative to the first regions 318b. For instance, the signal traces 318 can include a transition region connected between the first and second regions 318b and 318c as desired. Alternatively, the second regions 318c can extend from the first regions 318b.

The printed circuit board 300a can have multiple layers and more than two groups of routing channels per layer. The printed circuit board 300a can further include a plurality of second routing channels 319b operatively associated with the respective select ones of the second portions 346 of the first and second linear arrays 331a and 331b. Thus, the electrical traces 318 disposed in the second routing channels 319b can be electrically coupled to respective ones of the signal vias 332 of the respective select ones of the second portions 346 of the first and second linear arrays 331a and 331b. The second portions 346 of the first and second linear arrays 331a and 331b can include at least one differential signal pair of vias 332. For instance, the second portions 346 can include a first and second differential signal pairs of vias 332 that are separated by a ground via 334 along the second direction 304. Thus, the second routing channels 319b can include four signal traces 318 that are in electrical communication with respective ones of the four signal vias 332 that define the first and second differential signal pairs of vias 332. It should be appreciated that the second portions 346 of the linear arrays 331 can include any number of signal vias 332 as desired. Further, the second portions 346 of the first plurality of linear arrays 331a can have the same or a different number of signal vias 332 with respect to the number of signal vias 332 of the second plurality of linear arrays 331b of the second portion 346.

Each of the signal traces 318 can define a first end 318a that is electrically connected to a respective one of the signal vias 332 of the first portion 344 of each of the linear arrays 338 of the second group 342b. For instance, the first end 318a can be physically coupled to the electrically conductive material of the respective ones of the signal vias 332. The first ends 318a can extend along the first direction 302. The signal traces 318 can further include a first region 318b that extends relative to the first end 318a along the second direction 304. The first regions 318b of the signal traces 318 that are in electrical communication with the respective signal vias of the second portions 346 of the linear arrays 338 extend in an opposite direction with respect to the first regions 318b of the signal traces 318 that are in electrical communication the respective signal vias of the first portions 344 of the linear arrays 338. For instance, the first region 318b can extend from the first end 318a. The signal traces 318 can further include a second region 318c that extends relative to the first region 318b along a direction that is angularly offset with respect to the second direction 304. For instance, the second regions 318c can extends along the first direction 302. The second regions 318c can extend from the first regions 318b. The second regions 318c of the signal traces 318 that are in electrical communication with the respective signal vias of the second portions 346 of the linear arrays 338 can be disposed in the second margin 337b.

It should be appreciated that the signal traces 318 that are in electrical communication with the respective signal vias of the second portions 346 of the linear arrays 338 can include a first signal trace that is connected to a first signal via of one of the first linear arrays 338a, and the signal traces 318 can include a second signal trace that is connected to a second signal via of one of the second linear arrays 338b. For instance the one of the first linear arrays and the one of the second linear arrays can be adjacent linear arrays along the first direction. The first region of the first signal trace can be disposed between the first and second linear arrays 338a and 338b. The second region of the first signal trace in electrical communication with the first portion 344 of the linear arrays 338 can be disposed in the second margin 337b. Similarly, the second region of the second signal trace in electrical communication with the first portion 344 of the linear arrays 338 can be disposed in the second margin 337b. For instance, the signal traces 318 can include a first plurality of electrical signal traces 318, in electrical communication with the second portions 346 of the linear arrays 338, that includes the first signal trace, and a second plurality of electrical signal traces 318, in electrical communication with the second portions 346 of the linear arrays 338, that includes the second signal trace. The first ends 318a of each of the first plurality of signal traces 318 are attached to a respective one of the first signal vias of the first linear array 338a. Thus, the printed circuit board 300a can include a first signal channel that includes the first plurality of signal traces. The printed circuit board 300a can include a second signal channel that includes the second plurality of signal traces.

Each of the first plurality of signal traces 318 can be nested. Thus, the first regions 318b of inner ones of the signal traces 318 of the first plurality of signal traces 318 can be disposed inward with respect to the first regions 318b of outer ones of the signal traces 318 of the first plurality of signal traces 318 with respect to the first direction 302. Similarly, the second regions 318c of inner ones of the signal traces 318 of the first plurality of signal traces 318 can be disposed inward with respect to the second regions 318c of outer ones of the signal traces 318 of the first plurality of signal traces 318 with respect to the second direction 304. Each of the second plurality of signal traces 318 can be nested. Thus, the first regions 318b of inner ones of the signal traces 318 of the second plurality of signal traces 318 can be disposed inward with respect to the first regions 318b of outer ones of the signal traces 318 of the second plurality of signal traces 318 with respect to the first direction 302. Similarly, the second regions 318c of inner ones of the signal traces 318 of the second plurality of signal traces 318 can be disposed inward with respect to the second regions 318c of outer ones of the signal traces 318 of the second plurality of signal traces 318 with respect to the second direction 304. Further, the second plurality of signal traces 318 can be nested within the first plurality of signal traces 318. Thus, the first regions 318b of all of the second plurality of signal traces 318 can be disposed inward with respect to the first regions 318b of all of the signal traces 318 of the first plurality of signal traces 318 with respect to the first direction 302. Similarly, the second regions 318c of all of the second plurality of signal traces 318 can be disposed inward with respect to the second regions 318c of all of the first plurality of signal traces 318 with respect to the second direction 304.

The first ends 318a and at least a portion of the first regions 318b of select ones of the signal traces 318 can be disposed adjacent linear arrays 338 along the first direction. For instance, the first ends 318a and a majority of the first regions 318b of each of the first plurality of signal traces 318 can be disposed between adjacent ones of the first and second linear arrays 338a and 338b. It should be appreciated that the signal traces 318 can include a transition region connected between the first and second regions 318b and 318c as desired.

The signal vias 332 can include antipads so as to electrically isolate the signal vias from the electrical ground layers. Similarly, the ground vias 334 can include antipads as desired so as to electrically isolate the ground vias 334 from the ground layers other than the ground layer that is in electrical communication with the ground vias.

The second group 342b of linear arrays 338 can define an outermost one of the linear arrays 338 with respect to the first direction 302 that is spaced further than any other of the linear arrays 338 from the card edge 355 along the first direction 302. As described above, the signal traces 318 in electrical communication with the signal vias 332 of the second group 342b of the linear arrays 338 can be included in the second electrical signal layer 322a. The signal traces 318 in electrical communication with the signal vias 332 of the outermost linear array 338 of the second group 342 can extend from the respective signal vias 332 in the first direction, and thus parallel to the second regions 318c of other ones of the signal traces 318 of the second group 342b.

In accordance with one embodiment, a method can be provided for routing signal traces. The method can include the step of fabricating the first electrical signal layer 312a in the manner described above. Thus, the method can include the step of fabricating the signal traces 318 of the first electrical signal layer 312a as described above. The method can further include the step of fabricating the second electrical signal layer 322a in the manner described above. Thus, the method can include the step of fabricating the signal traces 318 of the second electrical signal layer 322a as described above. The method can further include the step of fabricating the first electrical ground layer 312b in the manner described above. The method can further include the step of fabricating the second electrical ground layer 322b in the manner described above. The method can further include the step of fabricating the signal vias 332 in the manner described above. The method can further include the step of fabricating the ground vias 334 in the manner described above. The method can further include teaching to a third party one or more of the above steps, teaching a third party a commercial advantage, such that routing layers can be reduced, and selling to the third party the printed circuit board 300a.

For instance a method can be provided for constructing a printed circuit board having a front card edge. The method can include the step of fabricating a linear array of vias including a first portion and a second portion, wherein each of the first and second portions includes a respective at least one ground via and at a respective least one signal via, the linear array oriented along a linear array direction. The method can further include the step of routing a first end of a first signal trace from the at least one signal via of the first portion, a first region that extends from the first end along the linear array direction, and a second region that extends relative to the first region along a first direction that is perpendicular to the linear array direction. The method can further include the step of routing a first end of a second signal trace from the at least one signal via of the second portion, a first region that extends from the first end along the linear array direction, and a second region that extends relative to the first region along a first direction that is perpendicular to the linear array direction. The second regions of the first and second signal traces can be disposed in respective first and second margins that are disposed on opposite sides of the first and second linear arrays with respect to the linear array direction. A method can further include teaching any of the above steps to a third party, teaching a third party a commercial advantage, such that routing layers can be reduced, teaching a third party a commercial advantage, such that routing layers can be reduced, and selling the constructed printed circuit board to the third party.

Another method can be provided for constructing a printed circuit board having a front card edge. The method can include the step of fabricating a first linear array of vias including at least one ground via and at a respective least one signal via. The method can further include the step of fabricating a second linear array of vias including at least one ground via and at a respective least one signal via, the second linear array spaced from the first linear array along a first direction, wherein each of the first and second linear arrays are oriented along a second direction perpendicular to the first direction. The method can further include the step of routing a first end of a first signal trace from the at least one signal via of the first linear array, a first region that extends from the first end along the second direction, and a second region that extends relative to the first region along the first direction. The method can further include the step of routing a first end of a second signal trace from the at least one signal via of the second linear array, a first region that extends from the first end along the linear array direction, and a second region that extends relative to the first region along a first direction that is perpendicular to the linear array direction. The method can further include the step of defining first and second margins disposed on opposite sides of the first and second linear arrays with respect to the second direction, and the routing steps comprise placing the second regions of the first and second linear arrays in the first and second margins, respectively. A method can further include teaching any of the above steps to a third party, and selling the constructed printed circuit board to the third party.

The embodiments described in connection with the illustrated embodiments have been presented by way of illustration, and the present invention is therefore not intended to be limited to the disclosed embodiments. Furthermore, the structure and features of each the embodiments described above can be applied to the other embodiments described herein, unless otherwise indicated. Accordingly, the invention is intended to encompass all modifications and alternative arrangements included within the spirit and scope of the invention, for instance as set forth by the appended claims.

What is claimed:

1. A printed circuit board defining a front card edge, the printed circuit board comprising:
   a first linear array of vias including at least one first ground via and at least one first signal via;
   a second linear array of vias spaced from the first linear array along a first direction, the second linear array including at least one second ground via and at least one second signal via, wherein each of the first and second linear arrays of vias extends along a second direction that is perpendicular to the first direction and parallel to the front card edge;
   a first electrical signal trace defining a first end that is electrically connected to the first signal via, a first region that extends along the second direction, and a second region that extends along the first direction; and
   a second electrical signal trace defining a first end that is electrically connected to the second signal via, a first region that extends along the second direction, and a second region that extends along the first direction,
   wherein:
   the first and second linear arrays comprise a first group, the printed circuit board further comprises:
      a second group of linear arrays that each includes at least one ground via and at least one signal via; and
      signal traces in electrical communication with respective ones of the signal vias of the second group, each having a portion that is aligned with a portion of respective ones of the signal traces that are in electrical communication with signal vias of the first group.

2. The printed circuit board as recited in claim 1, further defining first and second margins disposed on opposite sides of the first and second linear arrays with respect to the second direction, wherein the second region of each of the first and second electrical signal traces are disposed in the first margin.

3. The printed circuit board as recited in claim 2, wherein: each of the first and second linear arrays defines a respective first portion and a respective second portion spaced from the first portion along the second direction, and the first and second electrical signal traces are in electrical communication with the first and second signal vias, respectively, of the first portion,
the printed circuit board further comprises:
   a first electrical signal trace that includes 1) a first end electrically connected to a signal via of the second portion of the first linear array of vias, 2) a first region that extends opposite the first region of the first electrical signal trace in electrical communication with the first signal via of the first portion, and 3) a second region that extends in the first direction and is disposed in the second margin.

4. The printed circuit board of claim 1, wherein the first regions of each of the first and second electrical signal traces extend from the respective first end, and the second region of each of the first and second electrical signal traces extend from the respective first region.

5. The printed circuit board as recited in claim 1, comprising a first plurality of electrical signal traces including the first signal trace, each of the first plurality of electrical traces nested in each other.

6. The printed circuit board as recited in claim 1, further comprising a second plurality of electrical signal traces, each of the second plurality of electrical traces nested in an adjacent electrical signal trace.

7. The printed circuit board as recited in claim 6, wherein the second plurality of signal traces is nested in the first electrical signal trace.

8. The printed circuit board as recited in claim 1, further comprising an electrically conductive ground layer attached to the at least one first and second ground vias.

9. The printed circuit board as recited in claim 1, wherein the first and second linear arrays are offset with respect to each other along the second direction.

10. The printed circuit board as recited in claim 1, wherein the first region of the first signal trace is disposed between the first and second linear arrays with respect to the first direction.

11. The printed circuit board as recited in claim 1, wherein the second group of linear arrays is spaced from the first group of linear arrays along a third direction that is perpendicular to each of the first and second directions, and the second group of linear arrays is offset with respect to the first group of linear arrays along the first direction.

12. A printed circuit board defining a front card edge, the printed circuit board comprising:
   a first linear array extending along a linear array direction parallel to the front card edge, the at least one linear array including a first portion and a second portion spaced from the first portion along the linear array direction, each of the first and second portions including at least one signal via and at least one ground via;
   first and second margins disposed on opposite sides of the first linear array with respect to the linear array direction,
   a first electrical signal trace defining a first end that is electrically connected to a signal via of the at least one signal via of the first portion, a first region that extends with respect to the first end along the linear array direction, and a second region that extends with respect to the first region in the first margin along a first direction that is perpendicular to the linear array direction;
   a second electrical signal trace defining a first end that is electrically connected to a signal via of the at least one signal via of the second portion, a first region that extends with respect to the first end along the linear array direction, and a second region that extends with respect to the first region in the second margin along the first direction; and a second linear array of vias spaced from the first linear array along a first direction, the second linear array including first and second portions that each include at least one second ground via and at least one second signal via, wherein the first regions of each of the first and second signal traces are disposed between the first and second linear arrays with respect to the first direction.

13. The printed circuit board as recited in claim 12, wherein the first region of the second electrical signal trace extends from the respective first end to the second region along a direction opposite with respect to the direction that the first region of the first electrical signal trace extends from the respective first end to the respective second region.

14. The printed circuit board as recited in claim 12, wherein the first and second linear arrays are offset from each other with respect to the linear array direction.

15. The printed circuit board as recited in claim 12, further comprising an electrically conductive ground layer in electrical communication with the at least one ground via of each of the first and second portions of the linear array.

16. A method of constructing a printed circuit board having a front card edge, the method comprising:
   fabricating a linear array of vias including a first portion and a second portion, wherein each of the first and second portions includes a respective at least one ground via and at a respective least one signal via, the linear array oriented along a linear array direction;
   routing a first end of a first signal trace from the at least one signal via of the first portion such that a first region extends from the first end along the linear array direction, and a second region extends relative to the first region along a first direction that is perpendicular to the linear array direction;
   routing a first end of a second signal trace from the at least one signal via of the second portion, such that a first region extends from the first end along the linear array direction, and a second region extends relative to the first region along a first direction that is perpendicular to the linear array direction, wherein:
      the second regions of the first and second signal traces are disposed in respective first and second margins that are disposed on opposite sides of the first and second linear arrays with respect to the linear array direction; and
      the linear array comprises a first linear array, and the printed circuit board comprises a second linear array of vias spaced from the first linear array along the first direction, the second linear array including first and second portions that each include at least one second ground via and at least one second signal via, wherein the first regions of each of the first and second signal traces are disposed between the first and second linear arrays with respect to the first direction.

17. A method of constructing a printed circuit board having a front card edge, the method comprising fabricating a first linear array of vias including at least one ground via and at a respective least one signal via; fabricating a second linear array of vias including at least one ground via and at a respective least one signal via, the second linear array spaced from the first linear array along a first direction, wherein each of the first and second linear arrays are oriented along a second direction perpendicular to the first direction; routing a first end of a first signal trace from a signal via of the at least one signal via of the first linear array, a first region that extends from the first end along the second direction, and a second region that extends relative to the first region along the first direction; and routing a first end of a second signal trace from a signal via of the at least one signal via of the second linear array, a first region that extends from the first end along the linear array direction, and a second region that extends relative to the first region along a first direction that is perpendicular to the linear array direction wherein the first regions of each of the first and second signal traces are disposed between the first and second linear arrays with respect to the first direction; defining first and second margins disposed on opposite sides of the first and second linear arrays with respect to the second direction, and wherein the routing comprises placing the second regions of the first and second linear arrays in the first and second margins, respectively.

* * * * *